United States Patent
Cao et al.

(10) Patent No.: US 9,825,091 B2
(45) Date of Patent: Nov. 21, 2017

(54) MEMORY CELL STRUCTURES

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Heng Cao, Shanghai (CN); Shengfen Chiu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/380,899

(22) Filed: Dec. 15, 2016

(65) Prior Publication Data
US 2017/0301730 A1    Oct. 19, 2017

(30) Foreign Application Priority Data
Apr. 14, 2016   (CN) .......................... 2016 1 0231236

(51) Int. Cl.
*H01L 47/00* (2006.01)
*H01L 27/24* (2006.01)
(Continued)

(52) U.S. Cl.
CPC ...... *H01L 27/2409* (2013.01); *G11C 11/1659* (2013.01); *G11C 13/003* (2013.01); *G11C 13/0004* (2013.01); *H01L 27/224* (2013.01)

(58) Field of Classification Search
CPC ............... H01L 27/2409; H01L 27/224; G11C 13/0004; G11C 13/003
See application file for complete search history.

(56) References Cited

U.S. PATENT DOCUMENTS 8,284,589 B2 * 10/2012 Scheuerlein ........... B82Y 10/00
                                                         365/148
2008/0258129 A1 * 10/2008 Toda ....................... G11C 11/56
                                                         257/5
(Continued)

OTHER PUBLICATIONS

European Application No. 17164958.5, Extended European Search Report dated Sep. 18, 2017, 10 pages.

*Primary Examiner* — Yosef Gebreyesus
(74) *Attorney, Agent, or Firm* — Kilpatrick Townsend & Stockton LLP (57) ABSTRACT

A memory cell includes a first diode, a second diode, and a random access memory cell element. The first diode and the random access memory cell element are series connected between a bit line and a word line. The second diode and the random access memory cell element are series connected between the word line and a reset line. A set path is formed through the first diode and the random access memory cell element, and a reset path is formed through the random access memory cell element and the second diode. The first diode is configured to performed a read operation and a set operation. The second diode is configured to perform a reset operation. The memory cell has higher forward current, lower leakage current and smaller size comparing with conventional memory cells.

20 Claims, 5 Drawing Sheets (51) Int. Cl.
 *H01L 27/22* (2006.01)
 *G11C 13/00* (2006.01)
 *G11C 11/16* (2006.01)

(56) References Cited

U.S. PATENT DOCUMENTS

| | | |
|---|---|---|
| 2009/0180310 A1 | 7/2009 | Shimomura et al. |
| 2009/0257269 A1* | 10/2009 | Shepard ................ G11C 11/412 365/148 |
| 2012/0044736 A1 | 2/2012 | Chung |

* cited by examiner

MEMORY CELL STRUCTURES

CROSS-REFERENCES TO RELATED APPLICATIONS

This application claims priority to Chinese patent application No. 201610231236.5, filed on Apr. 14, 2016, the content of which is incorporated herein by reference in its entirety.

FIELD OF THE INVENTION

The present invention relates generally to integrated circuits. More particularly, embodiments of the present invention relate to a memory cell, a memory cell structure, and a memory cell array.

BACKGROUND OF THE INVENTION

A resistive random access memory (RRAM) has advantageous properties in numerous aspects, such as simple structure, fast speed, low power consumption, data stability and non-volatility, easy three-dimensional integration and multi-value storage, RRAM has become a hot research topic. The resistance in a resistive random access memory has a varistor behavior and can be changed by applying a voltage or a current to the bottom electrode of the RRAM, showing a low resistance state and a high resistance state for storing a logic "0" and a logic "1".

A RRAM generally requires a selector to eliminate the sneak leakage path. An NMOS transistor or a PN diode is typically used as the RRAM selector, which is called 1T1R or 1D1R. The 1T1R structure of an RRAM unit includes a transistor and an RRAM cell. The 1D1R structure of an RRAM unit includes a PN diode and an RRAM cell. A RRAM selector requires a high SET current and a high RESET current, small selector size, relatively high breakdown voltage and leakage. However, as the device size shrinks to 40 nm and below, the 1T1R and 1D1R structures cannot meet these design requirements.

At present, the transistor of the 1T1R structure of an RRAM unit can only reach 1/5 to 1/3 of the target specification, the leakage current is 0.5 to t time higher than the target value, and the transistor size is 10 times larger than the required size.

The RAM cell in the 1D1R structure of an RRAM unit should be a unipolar or nonpolar cell. However, the current RRAM unit is bipolar, that means the RRAM unit needs to pass a high forward current to implement the SET process and a high reverse current to implement the RESET process, but the diode can only pass a high current in one direction.

Thus, there is a need for a novel memory unit to solve the above-described problems.

BRIEF SUMMARY OF THE INVENTION

Embodiments of the present invention provide a memory cell, a memory cell structure, and a memory cell array that have higher forward current, lower leakage current and smaller size than conventional memory cells and memory cell arrays.

In some embodiments of the present invention, a memory cell includes a first diode, a second diode; and a random access memory cell element. The first diode and the random access memory cell element are series connected between a bit line and a word line. The second diode and the random access memory cell element are series connected between the word line and a reset line. A set path is formed through the first diode and the random access memory cell element, and a reset path is formed through the random access memory cell element and the second diode.

In an embodiment, the first diode and the second diode each include a first electrode and a second electrode, the second electrode of the first diode and the first electrode of the second diode are electrically connected to an end of the random access memory element, an opposite end of the random access memory element is electrically connected to the word line, the first electrode of the first diode is electrically connected to the bit line, the second electrode of the second diode is electrically connected to the reset line.

In an embodiment, the first electrode is a positive electrode and the second electrode is a negative electrode. In an alternative embodiment, the first electrode is a negative electrode and the second electrode is a positive electrode.

In an embodiment, the random access memory cell element is a resistive random access memory, a phase-change random access memory, or a magnetic random access memory.

In an embodiment, the bit line is disposed in parallel with the reset line. The bit line, the word line and the reset line are isolated from each other.

Embodiments of the present invention also provide a memory cell structure. The memory cell structure includes a semiconductor substrate, a first diode in the semiconductor substrate, a second diode in the semiconductor substrate and on one side of the first diode, the first and second diodes each comprising a first electrode and a second electrode, a first isolation structure disposed in the semiconductor substrate between the first and second diodes, a bit line on the semiconductor substrate and extending along a first direction, and a reset line on the semiconductor substrate and extending parallel to the bit line along the first direction. The memory cell structure also includes an interconnection metal layer on the semiconductor substrate between the bit line and the reset line and isolated from the bit line and the reset line, a first contact hole between the bit line and the first diode to electrically connect the first electrode of the first diode and the bit line, a second contact hole between the reset line and the second diode to electrically connect the reset line and the second electrode of the second diode, a third contact hole between the interconnection metal layer and the first diode to electrically connect the interconnection metal layer and the second electrode of the first diode, and a fourth contact hole between the interconnection metal layer and the second diode to electrically connect the interconnection metal layer and the first electrode of the second diode. The memory cell structure further includes a random access memory element on the interconnection metal layer and having an end electrically connected to the interconnection metal layer, and a word line on the random access memory element and electrically connected to an opposite end of the random access memory element, the word line extending in a second direction substantially perpendicular to the first direction.

In an embodiment, the bit line is on the first diode, and the reset line is on the second diode.

In an embodiment, the first electrode is a positive electrode and the second electrode is a negative electrode. In an alternatively embodiment, the first electrode is a negative electrode and the second electrode is a positive electrode.

In an embodiment, the first diode comprises a first N-type well region in the semiconductor substrate, and a first P-type doped region and a first N-type doped region in the first N-type well region and in proximity to a surface of the semiconductor substrate. The first P-type doped region and the first N-type doped region are separated from each other, the first P-type doped region is configured to be the positive electrode of the first diode, and the first N-type doped region is configured to be the negative electrode of the first diode.

In an embodiment, the second diode comprises a second N-type well region in the semiconductor substrate, and a second P-type doped region and a second N-type doped region in the second N-type well region and in proximity to a surface of the semiconductor substrate. The second P-type doped region and the second N-type doped region are separated from each other, the second P-type doped region is configured to be the positive electrode of the second diode, and the second N-type doped region is configured to be the negative electrode of the second diode.

In an embodiment, the first N-type doped region is adjacent to the second P-type doped region. Alternatively, the first P-type doped region is adjacent to the second N-type doped region.

In an embodiment, the memory cell structure further includes a P-type field region in the semiconductor substrate below the first N-type well region and the second N-type well region and having a upper surface adjacent to a bottom surface of the first N-type well region and a bottom surface of the second N-type well region.

In an embodiment, the random access memory cell element is a resistive random access memory, a phase-change random access memory, or a magnetic random access memory.

In an embodiment, the memory cell structure further comprises a second isolation structure in the first N-type well region between the first P-type doped region and the first N-type doped region and not extending through the first N-type well region.

In an embodiment, the memory cell structure further comprises a third isolation structure in the second N-type well region between the second P-type doped region and the second N-type doped region and not extending through the second N-type well region.

Embodiments of the present invention also provide a memory cell array. The memory cell array includes M rows and N columns of memory cells, where M and N are a natural number greater than one. Each memory cell comprises a first diode, a second diode, and a random access memory cell element having a first end and a second end opposite the first end. The first diode and the random access memory cell element are series connected between a bit line and a word line. The second diode and the random access memory cell element are series connected in series between the word line and a reset line. A set path is formed through the first diode and the random access memory cell element, and a reset path is formed through the random access memory cell element and the second diode.

In an embodiment, the first diode and the second diode each include a first electrode and a second electrode, the second electrode of the first diode and the first electrode of the second diode are electrically connected to a first end of the random access memory element.

The memory cell array further includes M word lines, N bit lines and N reset lines. Each of the M word lines is associated with one of the M rows. Each of the N bit lines and each of the N reset lines are associated with one of the N columns and disposed in parallel to each other. The M word lines, the N bit lines, and the N reset lines are isolated from each other. The first electrodes of the first diodes of the memory cells disposed on a same column are electrically connected to a bit line associated with the same column, the second electrodes of the second diodes of the memory cells disposed on a same column are electrically connected to a reset line associated with the same column, the second ends of the random access memory elements of the memory cells disposed on a same row are electrically connected to a word line associated with the same row.

In an embodiment, the first electrode is a positive electrode and the second electrode is a negative electrode, or the first electrode is a negative electrode and the second electrode is a positive electrode.

In an embodiment, the random access memory cell element is a resistive random access memory, a phase-change random access memory, or a magnetic random access memory.

The following description, together with the accompanying drawings, will provide a better understanding of the nature and advantages of the claimed invention.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention. For purposes of clarity, not every component may be labeled in every drawing.

It will be understood that, when an element or component is referred to as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

Figure 1A:
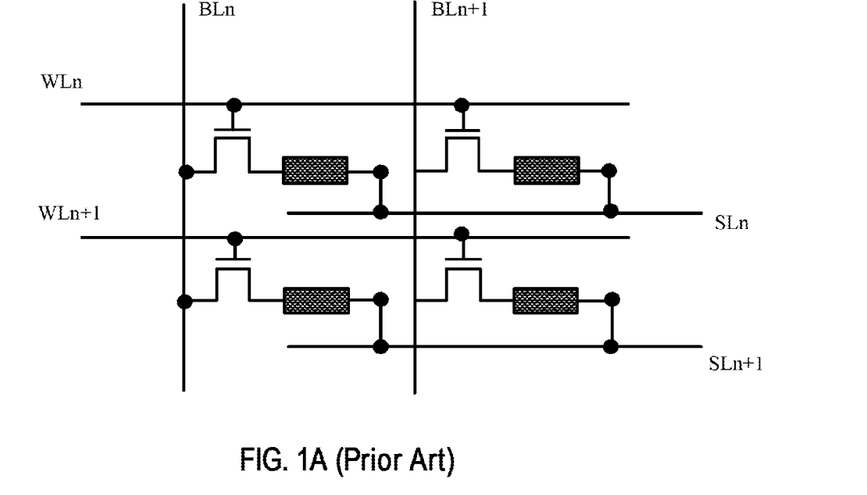
FIG. 1A is a schematic circuit diagram illustrating a conventional 1T1R structure of an RRAM cell array.

FIG. 1A is a schematic circuit diagram illustrating a conventional 1T1R structure of an RRAM cell array. The transistor of the conventional 1T1R structure can only provide a drive current that is 1/5 to 1/3 of the target drive current, has a leakage current that is 0.5 to 1 time higher than the target value, and a size that is 10 times the target size. Thus, it is difficult to realize a high drive current (typically greater than several hundred A) and low leakage current (typically lower than 10 pA) with a small size 1T1R structure.

Figure 1B:
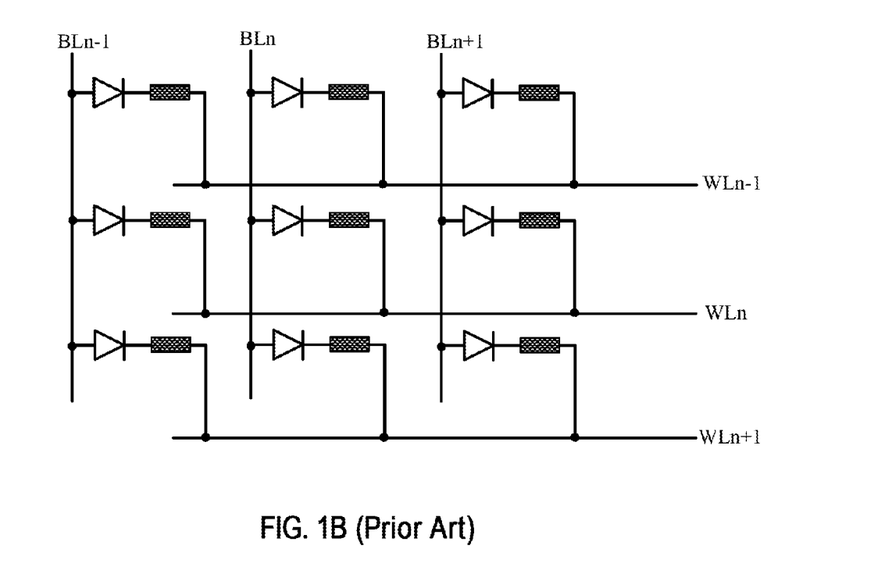
FIG. 1B is a schematic circuit diagram illustrating a conventional 1D1R structure of an RRAM cell array.

FIG. 1B is a schematic circuit diagram illustrating a conventional 1D1R structure of an RRAM cell array. The RAM cell in the 1D1R structure of an RRAM unit should be a unipolar or nonpolar cell. However, the current RRAM unit is bipolar, i.e., the RRAM unit needs to pass a high forward current to implement the SET operation and a high reverse current to implement the RESET operation, however, the diode can pass a high current only in one direction. Thus, the 1D1R structure of an RRAM unit cannot provide a high reverse current to meet the needs of the SET and REST operations of the bipolar RRAM memory cell.

Embodiments of the present disclosure provide a novel memory cell to solve the above-described problems.

Embodiment 1

Figure 2A:
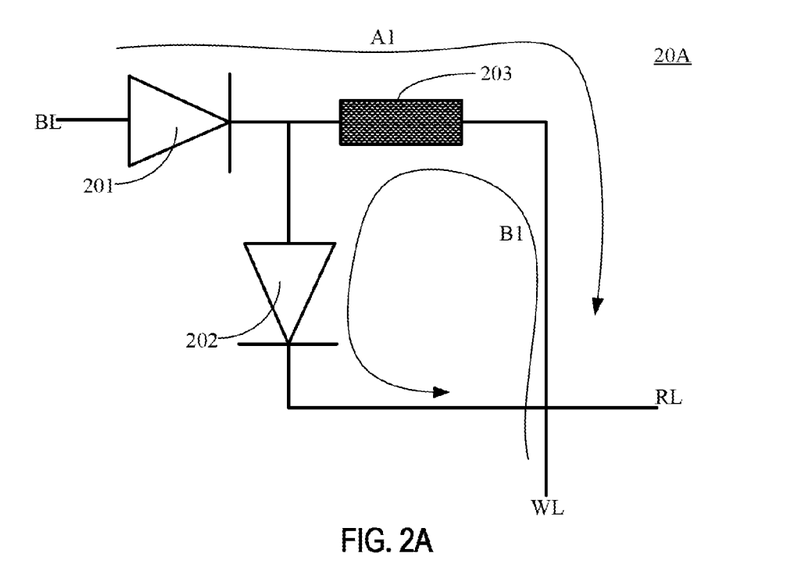
FIG. 2A is a schematic circuit diagram illustrating a memory cell according to one embodiment of the present invention.
Figure 2B:
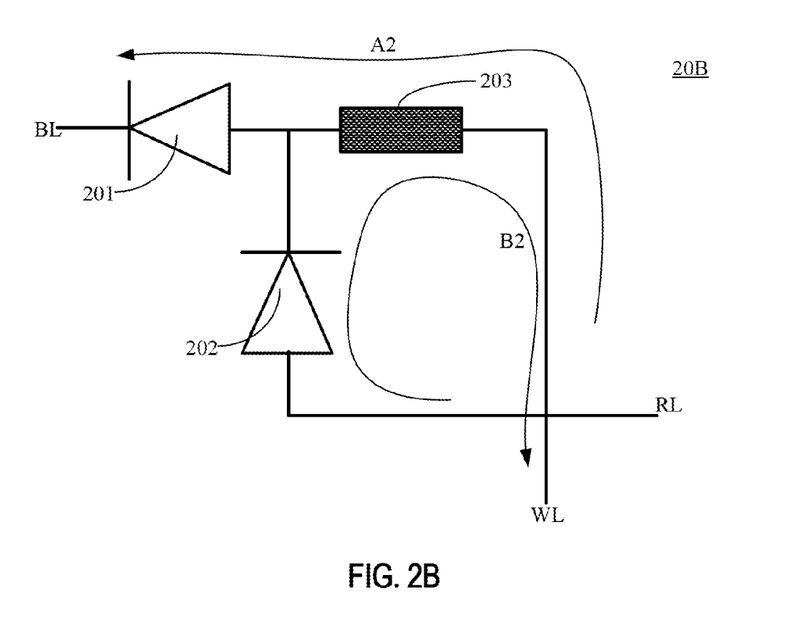
FIG. 2B is a schematic circuit diagram illustrating a memory cell according to another embodiment of the present invention.

FIG. 2A is a schematic circuit diagram illustrating a memory cell 20A according to one embodiment of the present invention. FIG. 2B is a schematic circuit diagram illustrating a memory cell 20B according to another embodiment of the present invention.

In accordance with the present disclosure, a memory cell mainly includes a first diode, a second diode, and a random access memory element. The first diode and the random access memory element are connected in series between a bit line and a word line. A current flowing through the first diode and the random access memory element forms a SET path. The second diode and the random access memory element are connected in series between the word line and a RESET line. A current flowing through the random access memory element and the second diode forms a RESET path.

Further, the first and second diodes each include a first electrode and a second electrode. The second electrode of the first diode and the first electrode of the second diode are electrically connected to one end of the random access memory element, the other end of the random access memory element is electrically connected to the word line. The first electrode of the first diode is electrically connected to the bit line. The second electrode of the second diode is electrically connected to the RESET line.

The first electrode is a positive electrode, and the second electrode is a negative electrode. Alternatively, the first electrode is a negative electrode, and the second electrode is a positive electrode.

In an exemplary embodiment, referring to FIG. 2A, memory cell 20A includes a first diode 201, a second diode 202, and a random access memory element 203. First diode 201 and random access memory element 203 are connected in series between a bit line BL and a word line WL. A current flowing from bit line BL through first diode 201 and random access memory element 203 forms a SET path, in the direction indicated by an arrow denoted "A1". Second diode 202 and random access memory element 203 are connected in series between the word line WL and a reset line RL. A current flowing from word line WL through random access memory element 203 and second diode 202 forms a RESET path, in the direction indicated by an arrow denoted "B1".

Referring still to FIG. 2A, first diode 201 and second diode 202 each include a positive electrode (anode) and a negative electrode (cathode). As used herein, the terms "positive electrode" and "anode" are used interchangeably. The terms "negative electrode" and "cathode" are used interchangeably. The negative electrode of first diode 201 and the positive electrode of second diode 202 are electrically connected to one end of random access memory element 203, the other end of random access memory element 203 is electrically connected to the word line WL. The positive electrode of first diode 201 is electrically connected to the bit line BL. The negative electrode of second diode 202 is electrically connected to the reset line RL.

In another exemplary embodiment, referring to FIG. 2B, memory cell 20B includes a first diode 201, a second diode 202, and a random access memory element 203. First diode 201 and random access memory element 203 are connected in series between a bit line BL and a word line WL. A current flowing from word line WL through random access memory element 203 and first diode 201 forms a SET path, in the direction indicated by a arrow denoted "A2". Second diode 202 and random access memory element 203 are connected in series between the word line WL and a reset line RL. A current flowing from reset line RL through second diode 202 and random access memory element 203 forms a RESET path, in the direction indicated by an arrow denoted "B2".

Referring still to FIG. 2B, first diode 201 and second diode 202 each include a positive electrode (anode) and a negative electrode (cathode). The positive electrode of first diode 201 and the negative electrode of second diode 202 are electrically connected to one end of random access memory element 203, the other end of random access memory element 203 is electrically connected to the word line WL. The negative electrode of first diode 201 is electrically connected to the bit line BL. The positive electrode of second diode 202 is electrically connected to the reset line RL.

The electrically conductive reset line RL is provided in parallel in the same direction as the bit line and spaced apart from the bit line.

Further, the bit line BL, the word line WL, and the reset line RL are isolated from each other.

It is to be understood that, in accordance with the present disclosure, the type of diode may be any PN diode, germanium diode, and silicon diode.

By way of example, the random access memory element 203 may be any type of random access memory known to one of skill in the art. For example, random access memory element 203 may be a resistive random access memory (RRAM), a phase-change random access memory (PCRAM), or a magnetic random access memory (MRAM).

It is to be understood that the resistive random access memory can store data using the variable resistance characteristics of the transition metal oxide (e.g., the resistance value changes with voltage). The resistive random access memory may include a stack of sequentially formed bottom electrode, a resistive material layer and a top electrode. The resistive material layer may be formed of a transition metal oxide, and the bottom and top electrodes may be formed of a conductive material (e.g., a metal or a metal oxide).

In an exemplary embodiment, the random access memory element 203 may be a resistive random access memory, the cathode of the first diode 201 and the anode of the second diode 201 are electrically connected to one end of the resistive random access memory. For example, the cathode of the first diode 201 and the anode of the second diode 201 are electrically connected to the bottom electrode of the resistive random access memory 203, and the other end of the resistive random access memory 203 is electrically connected to the word line WL. In a specific embodiment, the top electrode of the resistive random access memory 203 is electrically connected to the word line WL. Further, the anode of the first diode 201 is electrically connected to the bit line BL, and the cathode of the second diode 202 is electrically connected to the reset line RL.

Further, a current flowing from the bit line BL through the first diode 201 and the random access memory element 203 forms a SET path. The SET path, indicated by arrow denoted "A1" in FIG. 2A, enables the set operation and the read operation. A current flowing from the word line WL through the random access memory element 203 and the second diode 202 forms a RESET path. The RESET path, indicated by arrow denoted "B1" in FIG. 2A, enables the reset operation.

Alternatively, referring to FIG. 2B, the random access memory element 203 may be a resistive random access memory, the anode of the first diode 201 and the cathode of the second diode 201 are electrically connected to one end of the resistive random access memory 203. For example, the anode of the first diode 201 and the cathode of the second diode 201 are electrically connected to the bottom electrode of the resistive random access memory 203, and the other end of the resistive random access memory 203 is electrically connected to the word line WL. In a specific embodiment, the top electrode of the resistive random access memory 203 is electrically connected to the word line WL. Alternatively, the anode of the first diode 201 and the cathode of the second diode 202 are electrically connected to the top electrode of the resistive random access memory 203, and the bottom electrode of the resistive random access memory 203 is electrically connected to the word line WL.

Further, the cathode of the first diode 201 is electrically connected to the bit line BL, and the anode of the second diode 202 is electrically connected to the reset line RL.

In summary, the memory cell of the present disclosure includes two diodes and a resistive random access memory, which is referred to as "2D1R" structure. The memory cell of the present disclosure can meet the requirements of a bipolar RRAM, in which one diode is used for the read operation and the set operation, and the second diode is used for the reset operation. The memory cell of the present disclosure can increase the forward drive current to reach the mA range, decrease the leakage current down to the pA range, and enable the use of a small size diode, thereby reducing the size of the memory cell.

Embodiment 2

Figure 3:
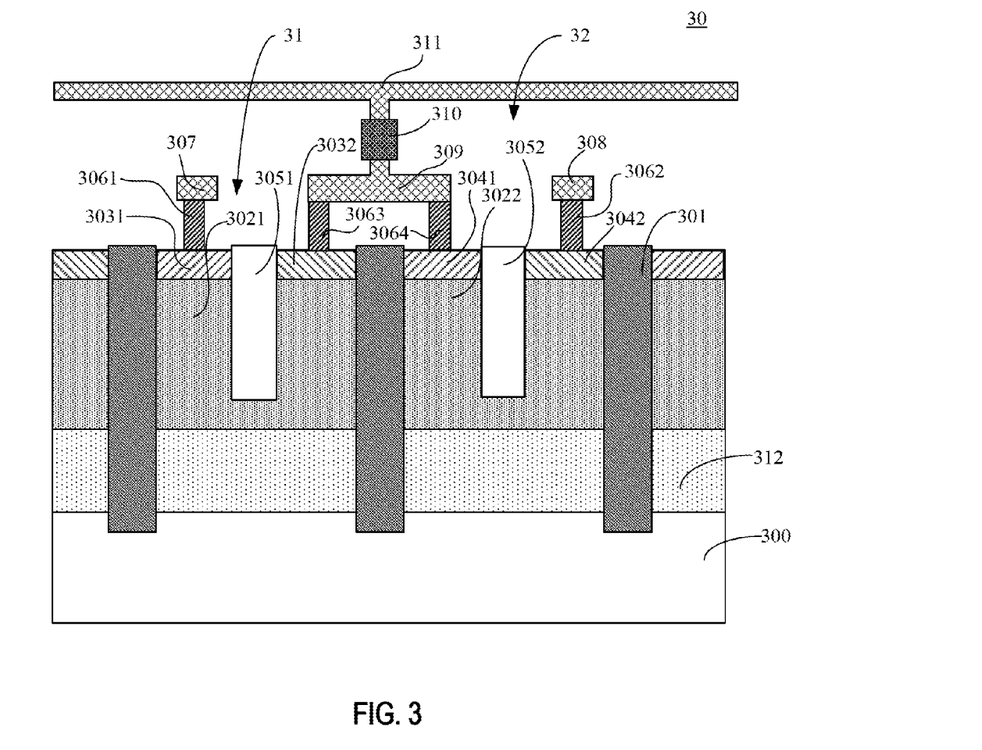
FIG. 3 is a cross-sectional view of a memory cell structure according to one embodiment of the present invention.

In view of the advantages provided by the above-described memory cell, the present disclosure also provides a memory cell structure. FIG. 3 is a cross-sectional view of a memory cell structure 30 according to one embodiment of the present invention.

Referring to FIG. 3, memory cell structure 30 includes a semiconductor substrate 300. Semiconductor substrate 300 may include undoped single-crystal silicon, doped with impurities silicon, silicon on insulator (SOI), stacked silicon on insulator (SSOI), silicon-germanium-on-insulator laminate (Si—SiGeOI), silicon-germanium-on-insulator (Si-GeOI), germanium on insulator (GeOI), and the like. In an exemplary embodiment, semiconductor substrate 300 includes a single-crystal silicon material.

Memory cell structure 30 also includes a first diode 31 and a second diode 32. First and second diodes 31, 32 are provided in semiconductor substrate 300. Second diode 32 is provided on one side of first diode 31. First and second diodes 31 and 32 each include a first electrode and a second electrode.

Memory cell structure 30 also includes an isolation structure 301 disposed between first and second diodes 31 and 32 and in semiconductor substrate 300 and configured to isolate the first and second diodes. Isolation structure 301 may be a shallow trench isolation (STI) structure or a local silicon oxide (LOCOS) isolation structure.

In an exemplary embodiment, first diode 31 may include a first N-type well region 3021 and a first P-type doped region 3031 and a first N-type doped region 3032 in N-type well region 3021. First P-type doped region 3031 and first N-type doped region 3032 are disposed in close proximity to the surface of semiconductor substrate 300. First P-type doped region 3031 is configured to form a positive electrode (anode) of first diode 31, and first N-type doped region 3032 is configured to form a negative electrode (cathode) of the first diode.

Memory cell structure 30 further includes an isolation structure 3051 selectively disposed in first N-type well region 3021 between first P-type doped region 3031 and first N-type doped region 3032 for isolating the first P-type doped region and the first N-type doped region. Isolation structure 3051 extends downwardly from the surface of semiconductor substrate 300 but does not go through first N-type well region 3021. Isolation structure 3051 may be any type of isolation structure, e.g., a shallow trench isolation structure, as known in the art.

In an exemplary embodiment, second diode 31 may include a second N-type well region 3022, a second P-type doped region 3041 and a second N-type doped region 3042 in second N-type well region 3022. Second P-type doped region 3041 and second N-type doped region 3042 are disposed in close proximity to the surface of semiconductor substrate 300. Second P-type doped region 3041 is configured to form a positive electrode (anode) of second diode 32, and second N-type doped region 3042 is configured to form a negative electrode (cathode) of the second diode.

Memory cell structure 30 further includes an isolation structure 3052 disposed in second N-type well region 3022 between second P-type doped region 3041 and second N-type doped region 3042 for isolating the second P-type doped region and the second N-type doped region. Isolation structure 3052 extends downwardly from the surface of semiconductor substrate 300 but does not go through second N-type well region 3022. Isolation structure 3052 may be any type of isolation structure, e.g., a shallow trench isolation structure, as known in the art.

In an embodiment, first N-type doped region 3022 is adjacent to second P-type doped region 3041 and isolated from each other by an isolation structure 301. In an embodiment, isolation structure extends downwardly from the surface of the semiconductor through the first and second N-type well regions.

In another embodiment, first P-type doped region 3031 may also be disposed close to second N-type doped region 3042.

In an embodiment, first N-type doped region 3032 and second N-type doped region 3042 are both N+-type doped regions, and first P-type doped region 3031 and second P-type doped region 3041 are both P+-type doped regions. As used herein, an N- or P-type doped region is referred to a region having a dopant concentration of $10^{14}$ to $10^{17}$ atoms/cm$^3$. An N+ or P+ doped region is referred to a region having a dopant concentration of $10^{18}$ to $10^{20}$ atoms/cm$^3$.

In an embodiment, memory cell structure 30 further includes a P-type field region 312 in semiconductor substrate 300. P-type field region 312 is disposed below first N-type well region 3021 and second N-type well region 3022 and has a top surface adjacent to the bottom surface of the first N-type well region 3021 and second N-type well region 3022.

It is to be understood that the above-described N-type well region, N-type doped region, P-type doped region and P-type field region can be implemented using multiple ion implantation processes. The doping types of the well regions are different and the corresponding doped ions are also different.

Memory cell structure 30 further includes a bit line 307 disposed on semiconductor substrate 300 and extending along a first direction. Preferably, bit line 307 is disposed on first diode 31.

Memory cell structure 30 further includes a first contact hole 3061 disposed between bit line 307 and first diode 31 to electrically connected the first electrode of the first diode and the bit line. In an embodiment, the first electrode is a positive electrode and corresponds to first P-type doped region 3031.

In an embodiment, memory cell structure 30 further includes a reset line 308 disposed on semiconductor substrate 300 and extending in the first direction. Reset line 308 is parallel to the bit line 307. Preferably, reset line 308 is disposed on second diode 32, i.e., above the second electrode of second diode 32, as shown in FIG. 3. The second electrode of the second diode may be a negative electrode.

Memory cell structure 30 further includes a second contact hole 3062 disposed between second diode 32 and reset line 308 to electrically connected the second electrode of the second diode and the reset line. In an embodiment, the second electrode is a negative electrode and corresponds to second N-type doped region 3042.

In an embodiment, memory cell structure 30 further includes an interconnection metal layer 309 disposed between bit line 307 and reset line 308. Interconnection metal layer 309 is isolated from bit line 307 and reset line 308.

It is to be understood that bit line 307, reset line 308, and interconnection metal line 309 may be formed on the same surface, e.g., they may be formed simultaneously (concurrently) and made be made of any suitable electrically conductive material, such as a metal or semiconductor material. The metal material may be, e.g., Cu, aluminum, and the like. The semiconductor material may include, but not limited to, doped or undoped polysilicon, and the like.

Memory cell structure 30 further includes a third contact hole 3063 disposed between interconnection metal layer 309 and first diode 31 to electrically connected the interconnection metal layer and the second electrode of the first diode. In an embodiment, referring to FIG. 3, the second electrode of the first diode is a negative electrode, that is, the third contact hole 3063 electrically connects the interconnection metal layer 309 to the first N-type doped region 3032.

Memory cell structure 30 further includes a fourth contact hole 3064 disposed between interconnection metal layer 309 and second diode 32 to electrically connected the interconnection metal layer and the first electrode of the second diode. In an embodiment, the first electrode of the second diode is a positive electrode, the fourth contact hole 3064 is electrically connected the interconnection metal layer 309 and the second P-type doped region 3041.

It is to be understood that first contact hole 3061, second contact hole 3062, third contact hole 3064, and fourth contact hole 3064 may be any type of conductive contact holes made of a conductive material such as copper, aluminum, or tungsten. Interconnection metal structures such as copper interconnection metal structures and the like may be used instead the first, second, third, and fourth contact holes to electrically connect the diodes and the bit line 307, the reset line 308, or the interconnection metal layer 309 disposed thereon.

Further, in the above described embodiment, the first electrode is a positive electrode, and the second electrode is a negative electrode. Alternatively, the first electrode is a negative electrode, and the second electrode is a positive electrode.

In an embodiment, memory cell structure 30 further includes a random access memory element 310 disposed on the interconnection metal layer 309. Random access memory element 310 has one end electrically connected to the interconnection metal layer 309.

In an embodiment, memory cell structure 30 further includes a word line 311 disposed on random access memory element 310 and electrically connected to the other end of the random access memory element 310. Word line 311 extends along a second direction which is perpendicular to the first direction.

By way of example, random access memory element 310 may be any type of random aces memory known in the art. For example, random access memory element 310 may be the random access memory element 203 described above, which may be a resistive random access memory (RRAM), a phase-change random access memory (PCRAM), or a magnetic random access memory (MRAM).

In a preferred embodiment, random access memory element 310 is a resistive random access memory.

A resistive random access memory (RRAM) may utilize the variable resistance characteristics of the transition metal oxide (e.g., the resistance value varies with voltage) to store data.

The RRAM has two or more states with different resistance values, which correspond to different digital values. By applying a predetermined voltage or current to the RRAM, the RRAM switches from one state to another. For example, the RRAM has a relatively high resistance state (referred to as a "high-impedance state") and a relatively low resistance state (referred to as a "low-impedance state"). By applying a predetermined voltage or current to an electrode of the RRAM, the RRAM may switch from a high-impedance state to a low-impedance state, or from a low-impedance state to a high-impedance state.

In an embodiment, the RRAM includes a bottom electrode disposed on the interconnection metal layer 309, a resistive material layer disposed on the bottom electrode, and a top electrode disposed on the resistive material layer. The bottom electrode electrically connects to the interconnection metal layer 309, and the top electrode electrically connects to the word line 311. Further, the bottom electrode may have a direct contact with the interconnection metal layer 309 to achieve an electrical connection.

The bottom electrode may be made of gold (Au), platinum (Pt), ruthenium (Ru), iridium (Ir), titanium (Ti), aluminum (Al), copper (Cu), tantalum (Ta), tungsten (W), iridium-tantalum (Ir—Ta) alloy, or indium tin oxide (ITO). Alternatively, the bottom electrode may be made of oxide, nitride, fluoride, carbide, boride or silicide of the above-described metals, e.g., TaN, TiN, TiAN, TiW, or any combination thereof. In an embodiment, the bottom electrode includes a tantalum nitride layer and a titanium nitride layer.

The resistive material layer is formed on the bottom electrode and in direct contact with the bottom electrode. The resistive material layer has a thickness in the range between 20 nm and 100 nm. The resistive material layer may include one or more oxides of W, Ta, Ti, Ni, Co, Hf, Ru, Zr, Zn, Fe, Sn, Al, Cu, Ag, Mo, Cr. In some embodiments, silicon may be included to form the composite material of the resistive material layer. In other embodiments, hafnium oxide and/or zirconium oxide may be used as materials for the resistive material layer.

In an embodiment, a protective layer may be selectively formed on the resistive material layer. In some embodiments, the protective layer is a metal, such as titanium, hafnium, platinum, and tantalum. The protective layer may have a thickness in the range between about 20 Angstroms and about 150 Angstroms, preferably in the range between 40 Angstroms and 80 Angstroms.

A top electrode is formed on the resistive material layer or on the optional protective layer. The top electrode may be formed of a metal, such as gold (Au), platinum (Pt), ruthenium (Ru), iridium (Ir), titanium (Ti), aluminum (Al), copper (Cu), tantalum (Ta), tungsten (W), iridium-tantalum (Ir—Ta) alloy, or indium tin oxide (ITO). Alternatively, the bottom electrode may be made of oxide, nitride, fluoride, carbide, boride or silicide of the above-described metals, e.g., TaN, TiN, TiAlN, TiW, or any combination thereof. The top electrode has a thickness in the range between about 100 nm and about 500 nm.

It is to be understood that the memory cell structure 30 may include, in addition to the above-described layers and elements, other layer and element structures. For example, the memory cell structure may include an interlayer dielectric layer, and the contact holes may be formed in the interlayer dielectric layer. The interlayer dielectric layer may include $SiO_2$, fluorocarbon (CF), carbon-doped silicon oxide (SiOC), or silicon carbon-nitride (SiCN). Alternatively, the interlayer dielectric layer may include an SiCN layer on a fluorocarbon (CF) layer. The fluorocarbon (CF) layer includes fluorine (F) and carbon (C) as the main components. The fluorocarbon (CF) may include a material having an amorphous (non-crystalline) structure. A porous structure, e.g., carbon doped silicon oxide (SiOC) may be used for the interlayer dielectric layer.

In an embodiment, the negative electrode of first diode 31 and the positive electrode of second diode 32 are electrically connected to the bottom electrode of the resistive random access memory element 310. The top electrode of the resistive random access memory element 310 is electrically connected to the word line 311. Further, the positive electrode of first diode 31 is electrically connected to the bit line 307, and the negative electrode of second diode 32 is electrically connected to the reset line 308.

Further, a current flowing starting from the bit line 307 through the first diode 31 and the resistive random access memory element 310 to the word line 311 forms a SET path. The SET path enables a set operation and a read operation. A current flowing starting from the word line WL through the resistive random access memory element 310 and the second diode 32 to the reset line RL forms a RESET path. The RESET path enables a reset operation.

Although FIG. 3 illustrates only a memory cell structure corresponding to the circuit configuration shown in FIG. 2A, the circuit configuration in FIG. 2B can also be obtained by modifying the structure in FIG. 3. For example, the circuit configuration of memory cell 20B in FIG. 2B can be obtained by alternating the bit line with the reset line, or by alternating the positions of the first N-type doped region and the first P-type doped region, or alternating the corresponding positions of the second N-type doped region and the second P-type doped region. Thus, any such modification and variations in the structure of the memory cell are intended to be included within the scope of the present disclosure.

In summary, the memory cell according to the present disclosure includes two diodes and a resistive random access memory element, such circuit structure is referred to as the 2D1R structure. The memory cell can meet the requirements of a bipolar RRAM. According to the present invention, one diode is used to enable the read operation and the set operation, while the other diode is used to enable the reset operation. The memory cell of the present invention can increase the forward current (i.e., the drive current) up to the mA level and reduce the leakage current down to the pA level. A smaller size of the diodes can also be used, thereby reducing the size of the memory cell.

Embodiment 3

In view of the multiple advantageous features of the novel memory cell, embodiments of the present invention also provide a memory cell array including at least one row or one column of the above-described memory cells.

Figure 4A:
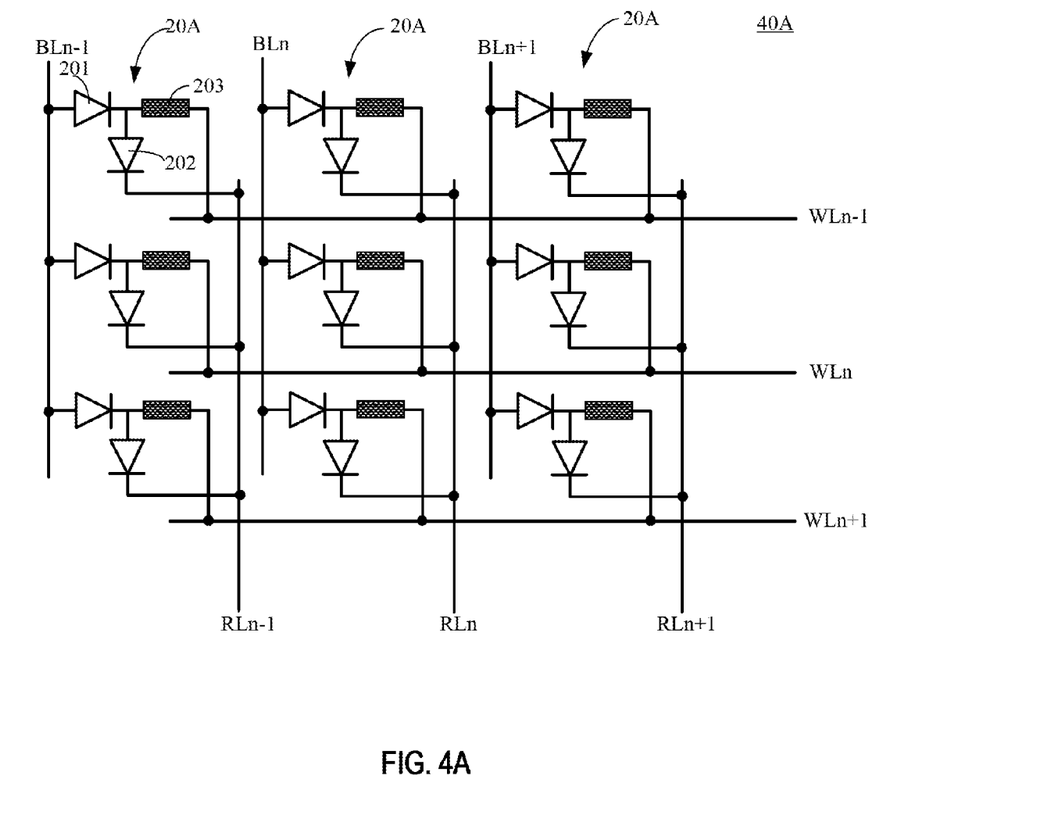
FIG. 4A is a schematic circuit diagram illustrating a memory cell array according to one embodiment of the present invention.
Figure 4B:
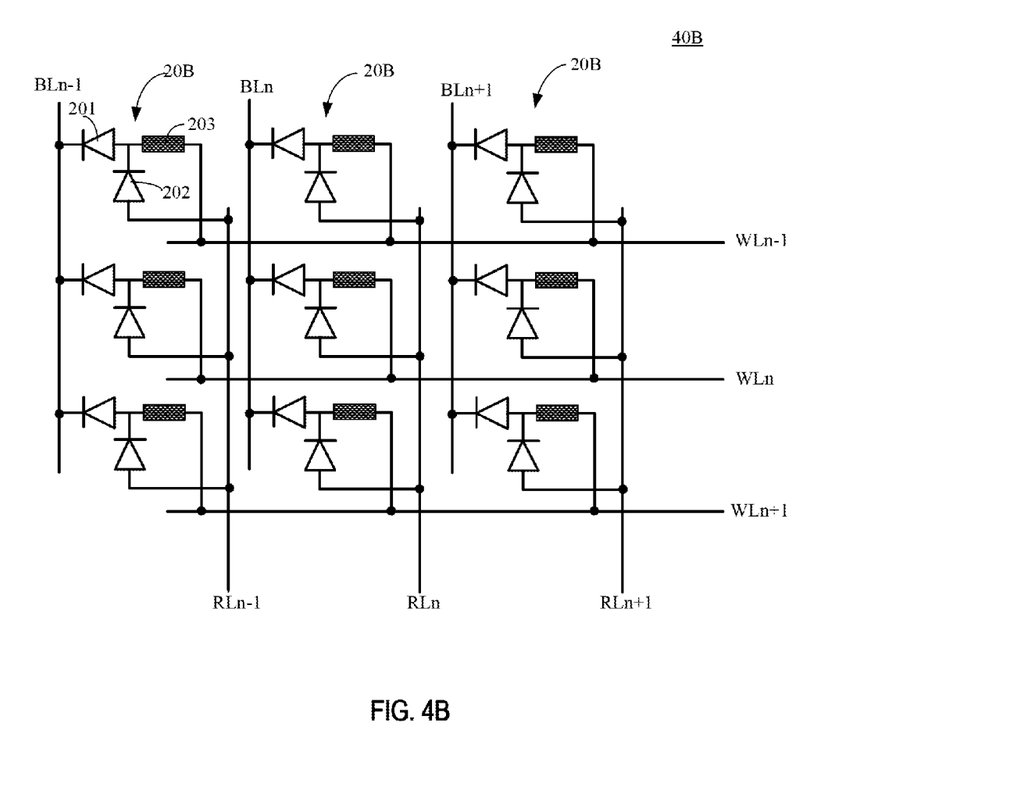
FIG. 4B is a schematic circuit diagram illustrating a memory cell array according to another embodiment of the present invention.

FIG. 4A is a schematic circuit diagram illustrating a memory cell array 40A according to one embodiment of the present invention. FIG. 4B is a schematic circuit diagram illustrating a memory cell array 40B according to one embodiment of the present invention.

By way of example, in accordance with the present invention, a memory cell array may include M rows and N columns of memory cells 20A or 20B (collectively referred to as memory cells 20). Each of the memory cells 20 includes a first diode 201, a second diode 202, and a random access memory element 203. First diode 201 and random access memory element 203 are connected in series and disposed between a bit line and a word line. A current flowing through first diode 201 and random access memory element 203 forms a set path. Second diode 201 and random access memory element 203 are connected in series and disposed between the word line and a reset line. A current flowing through random access memory element 203 and second diode 202 forms a reset path. In other words, a set path is formed through the first diode and the random access memory, and a reset path is formed through the random access memory and the second diode.

M and N are natural numbers greater than one. In the examples shown in FIGS. 4A and 4B, three rows (M=3) and three columns (N=3) are used to illustrate a memory cell array, however, it is understood that the numbers M and N are arbitrary chosen for describing the example embodiments and should not be limiting.

For purpose of clarity, only one memory cell 20 has assigned reference numerals, it is understood that other memory cells 20 each have same reference numerals for the same diodes and memory cell elements. For example, each memory cell 20 includes a first diode 201, a second diode 202, and a random access memory element 203.

Further, each of the first and second diodes includes a first electrode and a second electrode. In each memory cell 20, the second electrode of first diode 201 and the first electrode of second diode 202 are electrically connected to one end of random access memory element 203.

In an embodiment, the memory cell array may further include M word lines WL, N bit lines BL, and N reset lines RL. The bit lines and the reset lines are disposed in parallel with each other. The different bit lines, word lines, and reset lines are separated and isolated from each other.

The first electrode is a positive electrode, and the second electrode is a negative electrode. Alternatively, the first electrode is a negative electrode, and the second electrode is a positive electrode.

In an embodiment, the first electrode is a positive electrode, and the second electrode is a negative electrode, as shown in FIG. 4A. The positive (first) electrodes of the first diodes 201 disposed on a same column are electrically connected to the bit line BL associated with the same column. Referring to FIG. 4A, from left to right, the positive electrodes of the three first diodes 201 of the three ransom access memory cells 20 associated with the n−1 column are electrically connected to the bit line BLn−1 of the n−1 column; the positive electrodes of the three first diodes 201 of the three ransom access memory cells 20 associated with the n column are electrically connected to the bit line BLn of the n column, the positive electrodes of the three first diodes 201 of the three ransom access memory cells 20 associated with the n+1 column are electrically connected to the bit line BLn+1 of the n+1 column, and so forth.

Further, referring still to FIG. 4A, the negative (second) electrode of second diode 202 disposed on a same column are electrically connected to the reset line RL associated with the same column. Referring to FIG. 4A, from left to right, the negative electrodes of the second diodes 202 of the three ransom access memory cells 20 associated with the n−1 column are electrically connected to the reset line RLn−1 of the n−1 column; the negative electrodes of the second diodes 202 of the three ransom access memory cells 20 associated with the n column are electrically connected to the reset line RLn of the n column; the negative electrodes of the second diodes 202 of the three ransom access memory cells 20 associated with the n+1 column are electrically connected to the reset line RLn+1 of the n+1 column, and so forth.

Further, referring still to FIG. 4A, the other end of random access memory element 203 disposed on a same row are electrically connected to the word line WL associated with the same row. Referring to FIG. 4A, from top to bottom, the other ends of the random access memory elements 203 of the three ransom access memory cells 20 associated with the n−1 row are electrically connected to the n−1 word line WLn−1; the other ends of the random access memory elements 203 of the three ransom access memory cells 20 associated with the n row are electrically connected to the n−1 word line WLn; the other ends of the random access memory elements 203 of the three ransom access memory cells 20 associated with the n+1 row are electrically connected to the n+1 word line WLn+1, and so forth.

In another embodiment, referring to FIG. 4B, the first electrode is a negative electrode, and the second electrode is a positive electrode. The negative electrodes of the first diodes 201 disposed on a same column are electrically connected to the bit line BL associated with the same column. Referring to FIG. 4B, from left to right, the negative electrodes of the three first diodes 201 of the three ransom access memory cells 20 associated with the n−1 column are electrically connected to the bit line BLn−1 of the n−1 column; the negative electrodes of the three first diodes 201 of the three ransom access memory cells 20 associated with the n column are electrically connected to the bit line BLn of the n column, the negative electrodes of the three first diodes 201 of the three ransom access memory cells 20 associated with the n+1 column are electrically connected to the bit line BLn+1 of the n+1 column, and so forth.

Further, referring still to FIG. 4B, the positive electrodes of second diodes 202 disposed on a same column are electrically connected to the reset line RL associated with the same column. Referring to FIG. 4B, from left to right, the positive electrodes of the second diodes 202 of the three ransom access memory cells 20 associated with the n−1 column are electrically connected to the reset line RLn−1 of the n−1 column; the positive electrodes of the second diodes 202 of the three ransom access memory cells 20 associated with the n column are electrically connected to the reset line RLn of the n column; the positive electrodes of the second diodes 202 of the three ransom access memory cells 20 associated with the n+1 column are electrically connected to the reset line RLn+1 of the n+1 column, and so forth.

Further, referring still to FIG. 4B, the other ends of random access memory elements 203 disposed on a same row are electrically connected to the word line WL associated with the same row. Referring to FIG. 4B, from top to bottom, the other ends of the random access memory elements 203 of the three ransom access memory cells 20 associated with the n−1 row are electrically connected to the n−1 word line WLn−1; the other ends of the random access memory elements 203 of the three ransom access memory cells 20 associated with the n row are electrically connected to the n−1 word line WLn; the other ends of the random access memory elements 203 of the three ransom access memory cells 20 associated with the n+1 row are electrically connected to the n+1 word line WLn+1, and so forth.

It is to be understood that, in accordance with the present disclosure, the type of diode may be any PN diode, germanium diode, and silicon diode.

By way of example, the random access memory element 203 may be any type of random access memory known in the art. For example, random access memory element 203 may be a resistive random access memory (RRAM), a phase-change random access memory (PCRAM), or a magnetic random access memory (MRAM).

It is to be understood that the resistive random access memory can store data using the variable resistance characteristics of the transition metal oxide (e.g., the resistance value changes with voltage). The resistive random access memory includes a bottom electrode, a resistive material layer and a top electrode sequentially formed on the interconnection metal layer. The resistive material layer may be formed of a transition metal oxide, and the bottom and top electrodes may be formed of a conductive material (e.g., a metal or a metal oxide).

In an embodiment, the random access memory element 203 is preferably a resistive random access memory. As shown in FIG. 4A, a current flowing starting from the bit line BL through the first diode 201 and the resistive random access memory element 203 to the word line 311 forms a SET path. The SET path enables a set operation and a read operation. A current flowing starting from the word line WL through the resistive random access memory element 203 and the second diode 202 to the reset line RL forms a RESET path. The RESET path enables a reset operation.

In another embodiment, as shown in FIG. 4B, a current flowing starting from the word line WL through the resistive random access memory element 203 and the first diode 201 to the bit line BL forms a SET path. The SET path enables a set operation and a read operation. A current flowing starting from the reset line RL through the second diode 202 and the resistive random access memory element 203 to the word line WL forms a RESET path. The RESET path enables a reset operation.

Thus, the memory cell array, in accordance with the present invention, includes a plurality of memory cells. Each of the memory cells includes two diodes and a resistive random access memory element. The memory cell can meet the requirements of a bipolar RRAM. According to the present invention, one diode is used to enable the read operation and the set operation, while the other diode is used to enable the reset operation. Because the memory cell of the present invention provides a higher forward current (i.e., the drive current) up to the mA level and a leakage current down to the pA level, and the memory cell also can use a smaller size diode, the memory cell array that includes the memory cells has thus the same advantageous benefits as the memory cells.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A memory cell, comprising:
a first diode;
a second diode; and
a random access memory cell element,
wherein:
the first diode and the random access memory cell element are series connected between a bit line and a word line,
the second diode and the random access memory cell element are series connected between the word line and a reset line,
a set path is formed through the first diode and the random access memory cell element, and
a reset path is formed through the random access memory cell element and the second diode.

2. The memory cell of claim 1, wherein the first diode and the second diode each include a first electrode and a second electrode, the second electrode of the first diode and the first electrode of the second diode are electrically connected to an end of the random access memory element, an opposite end of the random access memory element is electrically connected to the word line, the first electrode of the first diode is electrically connected to the bit line, the second electrode of the second diode is electrically connected to the reset line.

3. The memory cell of claim 2, wherein the first electrode is a positive electrode and the second electrode is a negative electrode, or the first electrode is a negative electrode and the second electrode is a positive electrode.

4. The memory cell of claim 1, wherein the random access memory cell element is a resistive random access memory, a phase-change random access memory, or a magnetic random access memory.

5. The memory cell of claim 1, wherein the bit line is disposed in parallel with the reset line, and the bit line, the word line and the reset line are isolated from each other.

6. A memory cell structure, comprising:
a semiconductor substrate;
a first diode in the semiconductor substrate;
a second diode in the semiconductor substrate and on one side of the first diode, the first and second diodes each comprising a first electrode and a second electrode;
a first isolation structure disposed in the semiconductor substrate between the first and second diodes;
a bit line on the semiconductor substrate and extending along a first direction;
a reset line on the semiconductor substrate and extending parallel to the bit line along the first direction;
an interconnection metal layer on the semiconductor substrate between the bit line and the reset line and isolated from the bit line and the reset line;
a first contact hole between the bit line and the first diode to electrically connect the first electrode of the first diode and the bit line;
a second contact hole between the reset line and the second diode to electrically connect the reset line and the second electrode of the second diode;
a third contact hole between the interconnection metal layer and the first diode to electrically connect the interconnection metal layer and the second electrode of the first diode;
a fourth contact hole between the interconnection metal layer and the second diode to electrically connect the interconnection metal layer and the first electrode of the second diode;

a random access memory element on the interconnection metal layer and having an end electrically connected to the interconnection metal layer; and a word line on the random access memory element and electrically connected to an opposite end of the random access memory element, the word line extending in a second direction substantially perpendicular to the first direction.

7. The memory cell structure of claim 6, wherein the bit line is on the first diode, and the reset line is on the second diode.

8. The memory cell structure of claim 6, wherein the first electrode is a positive electrode and the second electrode is a negative electrode, or the first electrode is a negative electrode and the second electrode is a positive electrode.

9. The memory cell structure of claim 8, wherein the first diode comprises:

a first N-type well region in the semiconductor substrate; and a first P-type doped region and a first N-type doped region in the first N-type well region and in proximity to a surface of the semiconductor substrate, wherein the first P-type doped region and the first N-type doped region are separated from each other, the first P-type doped region is configured to be the positive electrode of the first diode, and the first N-type doped region is configured to be the negative electrode of the first diode.

10. The memory cell structure of claim 9, wherein the second diode comprises:

a second N-type well region in the semiconductor substrate; and a second P-type doped region and a second N-type doped region in the second N-type well region and in proximity to a surface of the semiconductor substrate, wherein the second P-type doped region and the second N-type doped region are separated from each other, the second P-type doped region is configured to be the positive electrode of the second diode, and the second N-type doped region is configured to be the negative electrode of the second diode.

11. The memory cell structure of claim 10, wherein the first N-type doped region is adjacent to the second P-type doped region, or the first P-type doped region is adjacent to the second N-type doped region.

12. The memory cell structure of claim 10, further comprising:

a P-type field region in the semiconductor substrate below the first N-type well region and the second N-type well region and having a upper surface adjacent to a bottom surface of the first N-type well region and a bottom surface of the second N-type well region.

13. The memory cell structure of claim 6, wherein the random access memory cell element is a resistive random access memory, a phase-change random access memory, or a magnetic random access memory.

14. The memory cell structure of claim 9, further comprising:

a second isolation structure in the first N-type well region between the first P-type doped region and the first N-type doped region and not extending through the first N-type well region.

15. The memory cell structure of claim 10, further comprising:

a third isolation structure in the second N-type well region between the second P-type doped region and the second N-type doped region and not extending through the second N-type well region.

16. A memory cell array, comprising:

M rows and N columns of memory cells, M and N being a natural number greater than one, wherein each memory cell comprises:

a first diode;

a second diode; and a random access memory cell element having a first end and a second end opposite the first end, wherein the first diode and the random access memory cell element are series connected between a bit line and a word line, wherein the second diode and the random access memory cell element are series connected in series between the word line and a reset line, wherein a set path is formed through the first diode and the random access memory cell element, and wherein a reset path is formed through the random access memory cell element and the second diode.

17. The memory cell array of claim 16, wherein the first diode and the second diode each include a first electrode and a second electrode, the second electrode of the first diode and the first electrode of the second diode are electrically connected to a first end of the random access memory element.

18. The memory cell array of claim 17, further comprising:

M word lines each of the M word lines associated with one of the M rows;

N bit lines and N reset lines, each of the N bit lines and each of the N reset lines associated with one of the N columns and disposed in parallel to each other, the M word lines, the N bit lines, and the N reset lines being isolated from each other, wherein:

the first electrodes of the first diodes of the memory cells disposed on a same column are electrically connected to a bit line associated with the same column, the second electrodes of the second diodes of the memory cells disposed on a same column are electrically connected to a reset line associated with the same column, second ends of the random access memory elements of the memory cells disposed on a same row are electrically connected to a word line associated with the same row.

19. The memory cell array of claim 17, wherein the first electrode is a positive electrode and the second electrode is a negative electrode, or the first electrode is a negative electrode and the second electrode is a positive electrode.

20. The memory cell array of claim 16, wherein the random access memory cell element is a resistive random access memory, a phase-change random access memory, or a magnetic random access memory.

* * * * *